United States Patent
Houston

(10) Patent No.: US 7,268,941 B2
(45) Date of Patent: Sep. 11, 2007

(54) MODULE INSPECTION FIXTURE

(75) Inventor: Charles R. Houston, Bealeton, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 411 days.

(21) Appl. No.: 11/067,846

(22) Filed: Feb. 28, 2005

(65) Prior Publication Data

US 2005/0189540 A1  Sep. 1, 2005

Related U.S. Application Data

(60) Provisional application No. 60/549,087, filed on Mar. 1, 2004.

(51) Int. Cl.
*G02B 21/26* (2006.01)
*G01N 21/00* (2006.01)

(52) U.S. Cl. .................. 359/394; 359/391; 356/237.4; 356/237.5

(58) Field of Classification Search ............. 356/237.2, 356/237.3, 237.4, 237.5; 359/391, 392, 394; 382/145, 147, 150; 53/107; 257/48
See application file for complete search history.

(56) References Cited

U.S. PATENT DOCUMENTS

| | | | | |
|---|---|---|---|---|
| 4,365,779 A | * | 12/1982 | Bates et al. | 248/371 |
| 4,887,904 A | * | 12/1989 | Nakazato et al. | 356/621 |
| 5,024,415 A | * | 6/1991 | Purens | 348/349.1 |
| 5,973,776 A | * | 10/1999 | Matsushita | 356/237.4 |
| 2003/0223111 A1 | * | 12/2003 | Lamvik et al. | 359/394 |

* cited by examiner

*Primary Examiner*—Shouxiang Hu
(74) *Attorney, Agent, or Firm*—Mark A. Wurm; Daniel J. Long

(57) ABSTRACT

An apparatus for inspecting semiconductor module packages which includes a cylindrical base section, a truncated spherical section superimposed on the cylindrical base capable of being rotated and tilted on the cylindrical base section, and a tray section superimposed on the truncated section.

20 Claims, 2 Drawing Sheets

MODULE INSPECTION FIXTURE

RELATED APPLICATION

This patent application is related to U.S. provisional patent application entitled "Module Inspection Fixture" having a Ser. No. 60/549,087 which was filed on Mar. 1, 2004, the teachings of which are herein incorporated by reference.

STATEMENT OF GOVERNMENT INTEREST

The invention described herein was made under Contract No. 54272DDP2S with the Government of the United States of America and may be manufactured and used by and for the Government of the United States of America for Governmental purposes without the payment of any royalties thereon or therefor.

BACKGROUND OF THE INVENTION

1. Field of the Invention

The present invention relates to the manufacture of semiconductors and more particularly to apparatus for inspecting semiconductor module packages.

2. Brief Description of Prior Developments

The prior art discloses a number of devices for inspecting module packages. Such devices, however, are complicated and expensive. Such devices often incorporate cameras and various illumination sources which may employ sophisticated electronics to aid in module inspection.

There is, however, a need for an apparatus to inspect semiconductor module packages which is inexpensive to build and simple to use.

SUMMARY OF INVENTION

The present invention is a simple module inspection fixture that holds the module in place allowing an operator to tilt and rotate the module in all directions up to 90 degrees.

The fixture has a half to one inch hollow base in which a sphere can rotate. The base holds the sphere in place. The sphere is flat on top and adapted to hold a plate that contains the module or die or other device to be inspected. The sphere can rotate in the base plate allowing inspection in all directions up to 90 degrees off the horizontal.

BRIEF DESCRIPTION OF THE DRAWINGS

The present invention is further described with reference to the accompanying drawings wherein.

BRIEF DESCRIPTION OF THE PREFERRED EMBODIMENT

Figure 1:
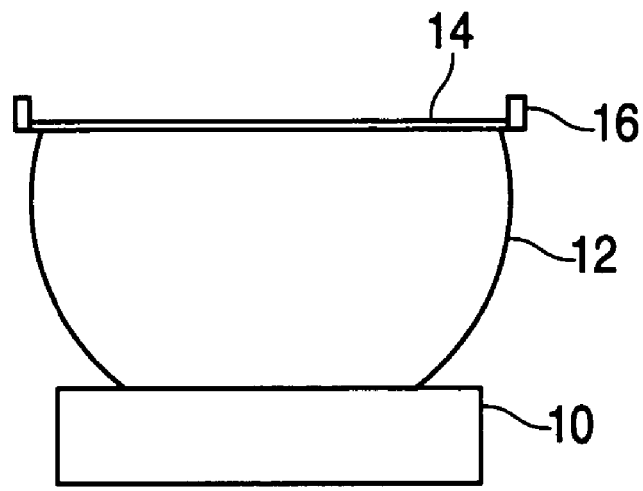
FIG. 1 is a side elevational view of a preferred embodiment of the apparatus of the present invention.
Figure 2:
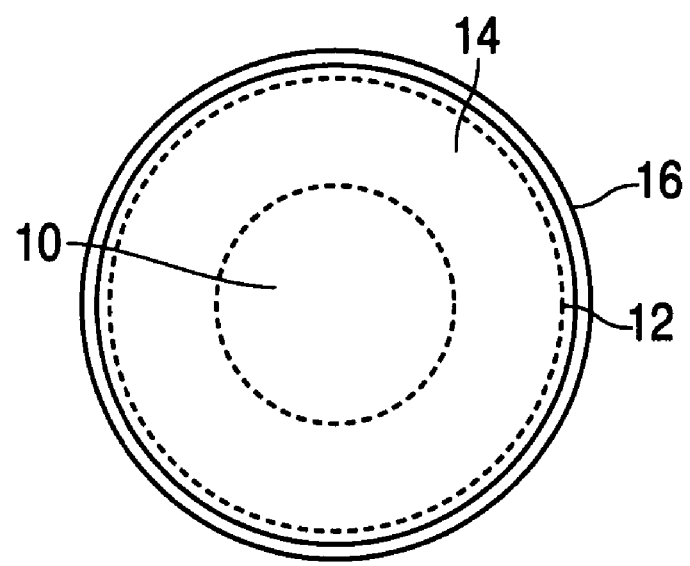
FIG. 2 is a top elevational view of the apparatus shown in FIG. 1.

Referring to FIGS. 1 and 2, the apparatus of the present invention includes a base cylindrical section 10 having a hollowed region for holding a spherical ball. A truncated spherical section 12 is superimposed on the cylindrical section 10 and can rotate and tilt 90° in all directions. A module tray 14 is shown having a peripheral lip 16 around the entire perimeter of the tray. The lip 16 is used to hold a module (not shown) or die or other device in place for inspection. The module tray 14 may be disengaged from the truncated spherical section 12 and may be replaced with a different sized tray which is capable of engaging other sizes and types of modules.

It is to be appreciated that an apparatus for inspecting semiconductor module packages has been described which is inexpensive to build and simple to use. The apparatus is designed to be rotated by the hand of the operator. If the base region 10 is smaller than the spherical section 12, the spherical section may be rotated off the horizontal by 90 degrees or more proving a complete 360 degree inspection of a semiconductor module.

Figure 3:
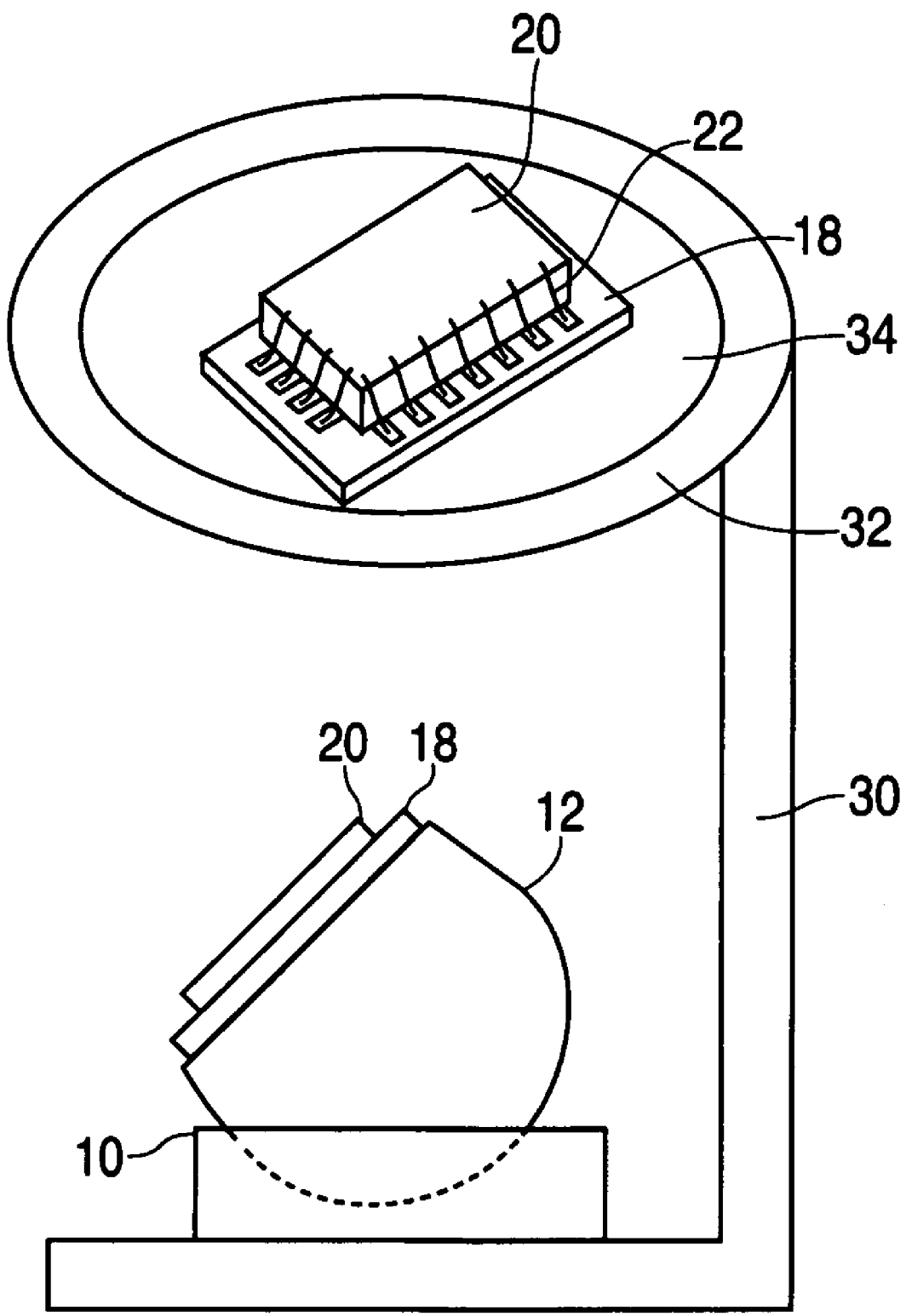
FIG. 3 illustrates the apparatus in use for inspection of a packaged semiconductor module.

FIG. 3 illustrates the inspection of a semiconductor module using the apparatus of the present invention. A semiconductor module 20 mounted on package 18 is attached directly to the fixture surface of truncated spherical section 12. This attachment may be via friction using gravity or via a tacky substance such as Gel-Pak® from Delphon Industries of Hayward, Calif. This attachment can be used with the tray 14 having a lip 16 or as an alternative in place of the module tray 14. Placement of the fixture with its base 10 under a low power inspection scope 30 produces an image as seen through the magnifying glass 34. The microscope 30 has a stand and a ring 32 which may contain a light for illuminating the object to be inspected. The illustrating image shows the module 20, package 18 and wire bonds 22. By rotating the truncated cylinder 12 within base 10, a full examination of the module 20 can be made. The inspection can be used to determine if the wire bonds are low enough in height to allow for capping with a lid or high enough not to be shorting out on the semiconductor or on the package.

The truncated cylinder and the base are coupled by friction. The weigh of the cylinder 12 should provide a proper amount of force permitting smooth and easy movement. The material of the base and cylinder can be aluminum or Plexiglas. If made of aluminum there is less concern about electrostatic discharge and damage to the object being inspected. Electrostatic discharge is a concern to prevent electrical damage to parts being inspected, therefore the operator should be properly grounded.

The size of the base and truncated cylinder should be correlated to the size of the objects being inspected. Normally a 2 to 2½ inch diameter cylinder would work well for inspecting semiconductor devices. If inspection of printed circuit cards is desired, a large cylinder and base could be used. Various components can be inspected using the present invention such as semiconductor chips, discrete transistors, capacitors and printed circuit boards as well as modules. The inspection may be for wire bonds, chipping of module or package edges, or the presence of foreign material.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An apparatus for inspecting semiconductor module packages comprising:

a cylindrical base section having a hollowed out region adapted for receiving a spherical shape;

a truncated spherical section superimposed on and in direct contact with the cylindrical base section which can be rotated and tilted on the cylindrical base section; and a tray section superimposed on the truncated spherical section for holding a semiconductor module package for inspection through a magnifying glass.

2. The apparatus of claim 1 wherein the base has a smaller diameter than the diameter of the truncated spherical section to provide a greater than 90 degree tilt from the horizontal.

3. The apparatus of claim 1 wherein the base and sphere are formed of metal to provide electrical conductivity to reduce damage to packages being inspected due to electrostatic discharge.

4. The apparatus of claim 3 wherein the metal is aluminum.

5. The apparatus of claim 1 wherein the cylindrical base and truncated spherical sections are formed of Plexiglas.

6. The apparatus of claim 1 wherein the tray is held in place by a releasable adhesive.

7. The apparatus of claim 1 wherein the tray has slots to allow the use of a tweezers to place and replace and remove the semiconductor module on the tray.

8. An apparatus for inspecting semiconductor module packages comprising:

a cylindrical base section having a hollowed out region adapted for receiving a spherical shape;

a truncated spherical section superimposed on and in direct contact with the cylindrical base section which can be rotated and tilted on the cylindrical base section; and a region on the truncated portion of the spherical section for receiving an object for inspection through a magnifying glass.

9. The apparatus of claim 8 wherein the base has a smaller diameter than the truncated spherical section to provide a greater than 90 degree tilt from the horizontal.

10. The apparatus of claim 8 wherein the base and sphere are formed of metal to provide electrical conductivity to reduce damage due to electrostatic discharge.

11. The apparatus of claim 10 wherein the metal is aluminum.

12. The apparatus of claim 8 wherein the cylindrical base and truncated spherical sections are formed of Plexiglas.

13. The apparatus of claim 8 wherein the object for inspection is held in place to the truncated portion of the spherical section by a releasable adhesive.

14. The apparatus of claim 8 wherein the truncated spherical region has slots to allow the use of a tweezers to place and remove the objects for inspection.

15. An apparatus for inspecting the mounting of components on a printed circuit card comprising:

a cylindrical base section having a hollowed out region adapted for receiving a spherical shape;

a truncated spherical section superimposed on and in direct contact with the cylindrical base section which can rotated and tilted on the cylindrical base section; and a region on the truncated spherical section adapted for receiving a print circuit card for inspection through a magnifying glass.

16. The apparatus of claim 15 wherein the base has a smaller diameter that the truncated spherical section to provide a greater than 90 degree tilt from the horizontal.

17. The apparatus of claim 15 wherein the base and sphere are formed of metal to provide electrical conductivity to reduce damage to the printed circuit card and components being inspected due to electrostatic discharge.

18. The apparatus of claim 17 wherein the metal is aluminum.

19. The apparatus of claim 15 wherein the cylindrical base and truncated spherical sections are formed of Plexiglas.

20. The apparatus of claim 15 wherein the printed circuit card is held in place for inspection by a releasable adhesive.

* * * * *